(12) United States Patent
Ueki et al.

(10) Patent No.: US 11,640,911 B2
(45) Date of Patent: May 2, 2023

(54) SUBSTRATE PROCESSING METHOD OF CONTROLLING DISCHARGE ANGLE AND DISCHARGE POSITION OF PROCESSING LIQUID SUPPLIED TO PERIPHERAL PORTION OF SUBSTRATE

(71) Applicant: Tokyo Electron Limited, Tokyo (JP)

(72) Inventors: Tatsuhiro Ueki, Koshi (JP); Jian Zhang, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/646,345

(22) Filed: Dec. 29, 2021

(65) Prior Publication Data
US 2022/0122853 A1 Apr. 21, 2022

Related U.S. Application Data

(62) Division of application No. 15/698,806, filed on Sep. 8, 2017, now Pat. No. 11,244,838.

(30) Foreign Application Priority Data

Sep. 13, 2016 (JP) .............................. JP2016-178708

(51) Int. Cl.
*H01L 21/67* (2006.01)
*G01N 21/95* (2006.01)
(Continued)

(52) U.S. Cl.
CPC ........ *H01L 21/6708* (2013.01); *B05B 12/084* (2013.01); *B05B 12/12* (2013.01);
(Continued)

(58) Field of Classification Search
CPC .................................................. H01L 21/67288
See application file for complete search history.

(56) References Cited

U.S. PATENT DOCUMENTS

| 4,328,553 A | 5/1982 | Fredriksen et al. |
| RE34,425 E | 11/1993 | Schultz |

(Continued)

FOREIGN PATENT DOCUMENTS

| JP | 2002-170802 A | 6/2002 |
| JP | 2004-363453 A | 12/2004 |
| JP | 2013-168429 A | 8/2013 |

*Primary Examiner* — Karl Kurple
(74) *Attorney, Agent, or Firm* — Pearne & Gordon LLP

(57) ABSTRACT

A substrate processing apparatus 1 is configured to supply a processing liquid to a peripheral portion of a wafer W being rotated. The substrate processing apparatus 1 includes a rotating/holding unit 21 configured to rotate and hold the wafer W; a processing liquid discharging unit 73 configured to discharge the processing liquid toward the peripheral portion of the wafer W held by the rotating/holding unit 21; a variation acquiring unit configured to acquire information upon a variation amount of a deformation of the peripheral portion of the wafer W; and a discharge controller 7 configured to control a discharge angle and a discharge position of the processing liquid from the processing liquid discharging unit 73 onto the peripheral portion based on the information upon the variation amount of the deformation of the peripheral portion acquired by the variation acquiring unit.

8 Claims, 8 Drawing Sheets

(51) Int. Cl.
    *B05B 12/08*     (2006.01)
    *B05C 11/10*     (2006.01)
    *G03F 7/16*     (2006.01)
    *G01B 11/02*     (2006.01)
    *H01L 21/66*     (2006.01)
    *B05B 12/12*     (2006.01)
    *B05D 1/00*     (2006.01)
    *B24B 49/04*     (2006.01)
    *G01B 11/06*     (2006.01)

(52) U.S. Cl.
    CPC ........ *B05B 12/124* (2013.01); *B05C 11/1005* (2013.01); *B05D 1/005* (2013.01); *B24B 49/045* (2013.01); *G01B 11/02* (2013.01); *G01B 11/06* (2013.01); *G01N 21/9501* (2013.01); *G01N 21/9503* (2013.01); *G03F 7/162* (2013.01); *H01L 21/67051* (2013.01); *H01L 21/67253* (2013.01); *H01L 21/67288* (2013.01); *H01L 22/12* (2013.01); *H01L 22/26* (2013.01); *G06T 2207/30148* (2013.01)

(56) References Cited

U.S. PATENT DOCUMENTS

| | | | |
|---|---|---|---|
| 5,688,324 A * | 11/1997 | Umaba | B05C 9/02 118/401 |
| 6,260,562 B1 * | 7/2001 | Morinishi | H01L 21/67051 134/113 |
| 6,354,907 B1 | 3/2002 | Satoh et al. | |
| 6,381,004 B1 | 4/2002 | Hagiwara et al. | |
| 6,439,963 B1 | 8/2002 | Rangarajan et al. | |
| 6,453,916 B1 * | 9/2002 | Tran | G03F 7/162 134/113 |
| 6,499,333 B1 | 12/2002 | Ko et al. | |
| 6,532,064 B1 * | 3/2003 | Hearn | G01N 21/8901 356/237.1 |
| 6,558,478 B1 | 5/2003 | Katakabe et al. | |
| 6,683,007 B1 * | 1/2004 | Yamasaki | B08B 3/02 257/E21.219 |
| 6,964,724 B2 | 11/2005 | Yamasaki et al. | |
| 7,227,628 B1 | 6/2007 | Sullivan et al. | |
| 7,303,633 B2 * | 12/2007 | Usami | B29D 17/005 118/320 |
| 7,476,290 B2 | 1/2009 | Saito et al. | |
| 7,935,948 B2 * | 5/2011 | Porras | H01L 21/67253 250/573 |
| 8,309,282 B2 | 11/2012 | Chung et al. | |
| 8,419,964 B2 | 4/2013 | Ganesan et al. | |
| 9,162,247 B2 * | 10/2015 | Yoshihara | H01L 21/6715 |
| 9,210,790 B2 | 12/2015 | Hoffman | |
| 9,687,873 B2 * | 6/2017 | Tachibana | G03F 7/162 |
| 9,914,150 B2 | 3/2018 | Pettersson et al. | |
| 10,236,192 B2 | 3/2019 | Nonaka et al. | |
| 10,386,821 B2 | 8/2019 | Musselman et al. | |
| 10,635,072 B2 | 4/2020 | Kobayashi | |
| 2002/0150679 A1 | 10/2002 | Minami et al. | |
| 2002/0174958 A1 | 11/2002 | Yanagita et al. | |
| 2003/0032379 A1 | 2/2003 | Taylor et al. | |
| 2003/0199112 A1 | 10/2003 | Shanmugasundram et al. | |
| 2004/0149322 A1 | 8/2004 | Peng et al. | |
| 2004/0180142 A1 * | 9/2004 | Kobayashi | B05D 1/005 427/240 |
| 2005/0150451 A1 * | 7/2005 | Tanaka | H01L 21/6715 118/688 |
| 2005/0239222 A1 | 10/2005 | Guthrie et al. | |
| 2006/0115142 A1 | 6/2006 | Sim | |
| 2007/0051393 A1 * | 3/2007 | Cho | B08B 3/04 134/149 |
| 2007/0209684 A1 | 9/2007 | Chen et al. | |
| 2009/0201485 A1 * | 8/2009 | Van Der Heijden | G03F 7/11 355/77 |
| 2010/0218784 A1 | 9/2010 | Chen | |
| 2011/0076599 A1 | 3/2011 | Chung et al. | |
| 2013/0084393 A1 | 4/2013 | Kashiyama et al. | |
| 2013/0114074 A1 * | 5/2013 | Nakajima | H01L 21/67288 356/237.5 |
| 2013/0156940 A1 | 6/2013 | Wu | |
| 2013/0206726 A1 * | 8/2013 | Oono | H01L 21/67253 216/85 |
| 2014/0062303 A1 | 3/2014 | Hoffman et al. | |
| 2014/0116480 A1 * | 5/2014 | Higashijima | H01L 21/67051 134/153 |
| 2014/0124479 A1 | 5/2014 | Tomita et al. | |
| 2014/0196663 A1 | 7/2014 | Kashiyama | |
| 2016/0144553 A1 | 5/2016 | Kobayashi | |
| 2016/0370795 A1 | 12/2016 | Musselman et al. | |
| 2018/0053319 A1 | 2/2018 | Kakuma et al. | |
| 2018/0218942 A1 | 8/2018 | Ivanov | |
| 2018/0226224 A1 | 8/2018 | Wu et al. | |
| 2018/0269080 A1 | 9/2018 | Schwab et al. | |
| 2018/0337067 A1 | 11/2018 | Kosai et al. | |
| 2020/0133144 A1 | 4/2020 | Schmitt-Weaver | |

\* cited by examiner

SUBSTRATE PROCESSING METHOD OF CONTROLLING DISCHARGE ANGLE AND DISCHARGE POSITION OF PROCESSING LIQUID SUPPLIED TO PERIPHERAL PORTION OF SUBSTRATE

CROSS-REFERENCE TO RELATED APPLICATION

This a divisional application of U.S. patent application Ser. No. 15/698,806 filed on Sep. 8, 2017, which claims the benefit of Japanese Patent Application No. 2016-178708 filed on Sep. 13, 2016, the entire disclosures of which are incorporated herein by reference.

TECHNICAL FIELD

The embodiments described herein pertain generally to a substrate processing apparatus and a substrate processing method of supplying a processing liquid to a peripheral portion of a substrate.

BACKGROUND

In a semiconductor device manufacturing apparatus, by supplying a processing liquid such as a chemical liquid onto a peripheral portion of a substrate such as a semiconductor wafer (hereinafter, simply referred to as "wafer") while rotating the substrate around a vertical axis in the state that the substrate is horizontally held, a resist film, a contaminant, an oxide film and the like which exist on the peripheral portion are removed. This removing processing is also called a "bevel cutting processing". It is desirable that the removing processing is performed with a required cutting width accurately along the entire circumference of the substrate.

By way of example, in a liquid processing apparatus described in Patent Document 1, for example, a peripheral portion of a substrate is imaged, and a removing width of a film on the peripheral portion thereof is calculated from the imaging result. Also, it is determined whether the removing width is appropriate. In this liquid processing apparatus, a deviation amount between a rotation center of a substrate holding unit and a center of the substrate is also calculated, and the substrate is held by the substrate holding unit in the state that the center of the substrate and the rotation center around the vertical axis are made to be coincident.

Meanwhile, a processing surface of a substrate may typically have a planar shape. Actually, however, the processing surface of the substrate may not be perfectly planar due to environmental factors or the like. For example, the processing surface may be varied in a thickness direction thereof in a unit of 1/10 millimeter. Particularly, a peripheral portion of the substrate may be strongly affected by bending of the substrate, and a surface position of this peripheral portion in the thickness direction is easily likely to be non-uniform.

In case of discharging a processing liquid in an inclined direction with respect to the substrate, a landing position of the processing liquid on the substrate may be differed depending on the surface positions in the thickness direction of the substrate. Thus, if the processing liquid is discharged in the inclined direction onto the peripheral portion of the substrate having non-uniform surface positions, the landing position of the processing liquid on the peripheral portion may be non-uniform, and the cutting width in the bevel cutting processing may not also be regular.

For this reason, there has been a demand for the effective bevel cutting processing capable of uniforming the cutting width by suppressing non-uniformity in the landing position of the processing liquid even in case where the surface positions of the peripheral portion of the substrate are not regular.

Patent Document 1: Japanese Patent Laid-open Publication No. 2013-168429

SUMMARY

In view of the foregoing, exemplary embodiments provide a technique capable of suppressing a variation in a cutting width of a bevel cutting processing on a peripheral portion of a substrate.

In an exemplary embodiment, there is provided a substrate processing apparatus configured to supply a processing liquid to a peripheral portion of a substrate being rotated. The substrate processing apparatus includes a rotating/holding unit configured to rotate and hold the substrate; a processing liquid discharging unit configured to discharge the processing liquid toward the peripheral portion of the substrate held by the rotating/holding unit; a variation acquiring unit configured to acquire information upon a variation amount of a deformation of the peripheral portion; and a discharge controller configured to control a discharge angle and a discharge position of the processing liquid from the processing liquid discharging unit onto the peripheral portion based on the information upon the variation amount of the deformation of the peripheral portion acquired by the variation acquiring unit.

In another exemplary embodiment, there is provided a substrate processing method of discharging a processing liquid from a processing liquid discharging unit toward a peripheral portion of a substrate being rotated. The substrate processing method includes acquiring information upon a variation amount of a deformation of the peripheral portion; and controlling a discharge angle and a discharge position of the processing liquid from the processing liquid discharging unit onto the peripheral portion based on the information upon the variation amount of the deformation of the peripheral portion.

According to the exemplary embodiments as described above, the variation in the cutting width of the bevel cutting processing on the peripheral portion of the substrate can be suppressed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2A illustrates a dummy-dispense arrangement for discharging a processing liquid to the outside of a wafer; FIG. 2B, a chemical liquid processing arrangement for discharging the processing liquid toward a peripheral portion of the wafer; and FIG. 2C, a rinse processing arrangement for discharging a rinse liquid toward the peripheral portion of the wafer;

FIG. 3A is a plan view of the wafer and FIG. 3B is a cross sectional view thereof;

DETAILED DESCRIPTION

Figure 1:
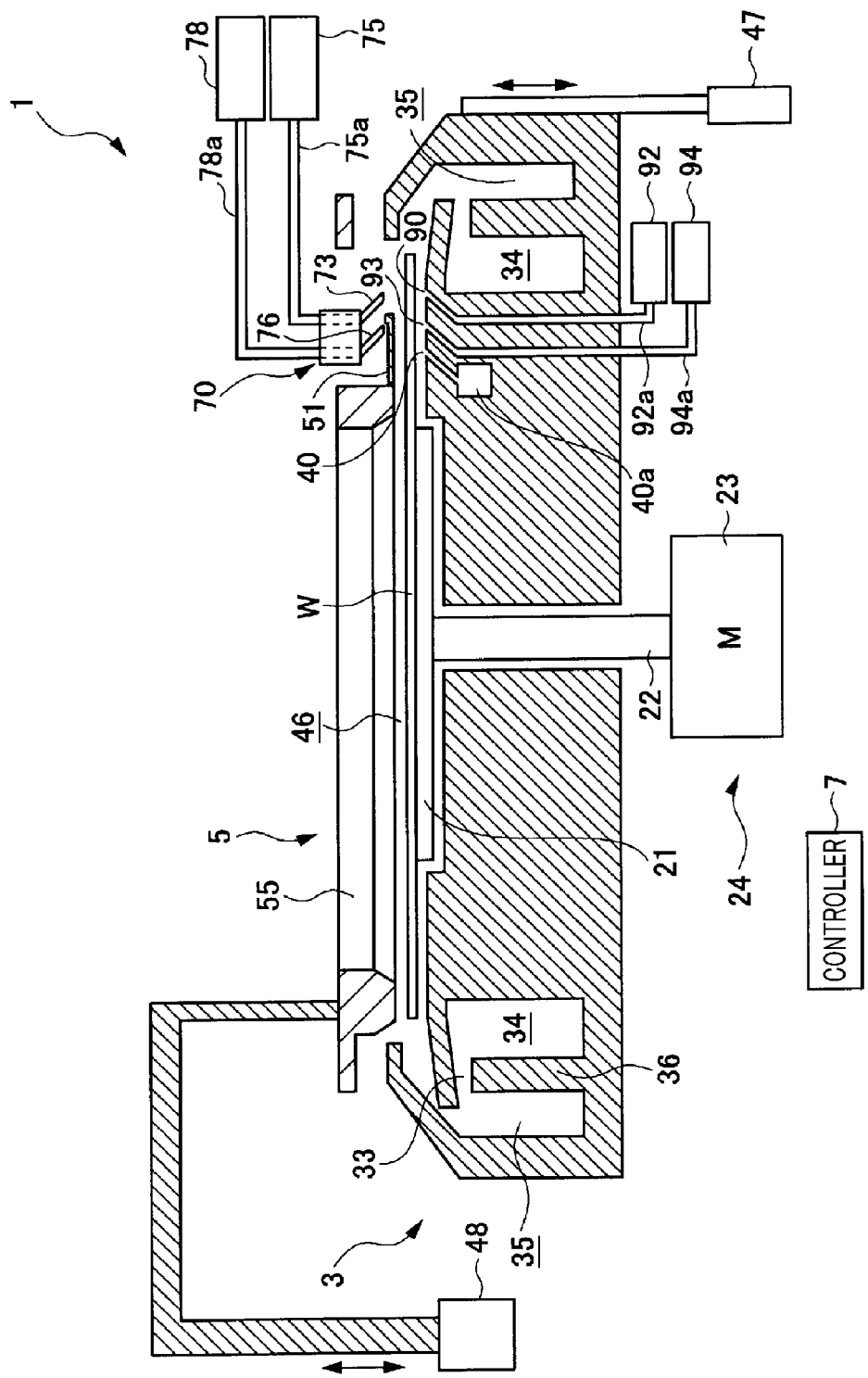
FIG. 1 is a longitudinal sectional view illustrating an example of a substrate processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment will be described with reference to the accompanying drawings. In the drawings, for the convenience of illustration and for the purposes of clear understanding, a scale, an aspect ratio and the like may be modified from actual dimensions.

[Entire Configuration of Substrate Processing Apparatus]

FIG. 1 is a longitudinal cross sectional view illustrating an example of a substrate processing apparatus 1.

The substrate processing apparatus 1 according to an exemplary embodiment is configured to perform a liquid processing on a wafer W as a substrate having a disk shape. Particularly, the substrate processing apparatus 1 performs the bevel cutting processing on the wafer W by supplying a processing liquid to a peripheral portion of the wafer W being rotated. The wafer W is provided with, for example, a SiN film (that is, a nitride film), and this film is formed to range from a top surface of the wafer W to a peripheral portion of a bottom surface of the wafer W via a side end portion thereof. The bevel cutting processing according to the exemplary embodiment is a processing of removing this film from the peripheral portion of the wafer W, and a processing liquid such as a chemical liquid configured to remove the film is used in this processing. The processing liquid that can be utilized in this bevel cutting processing may not be particularly limited. By way of non-limiting example, an alkaline chemical liquid such as a mixed solution of ammonia, hydrogen peroxide and pure water (i.e., a SC-1 solution) or an acidic chemical liquid such as a mixed solution of hydrofluoric acid (HF) and pure water (i.e., a HF solution) may be used as the processing liquid.

Further, the top surface and the bottom surface of the wafer W respectively refer to a surface located at an upper side and a surface located at a lower side when the wafer W is horizontally held. Further, the peripheral portion of the wafer W is an end portion region at an outer peripheral side of the wafer W where a pattern of a semiconductor device (that is, a device portion) is not formed.

The substrate processing apparatus 1 is equipped with a nozzle driving unit 70 including a chemical liquid nozzle 73 and a rinse nozzle 76. The chemical liquid nozzle 73 is connected to a first chemical liquid supply unit 75 via a supply line 75a, and the rinse nozzle 76 is connected to a first rinse liquid supply unit 78 via a supply line 78a. The chemical liquid nozzle 73 serves as a processing liquid discharging unit configured to discharge the processing liquid toward the peripheral portion of the wafer W held by a substrate holding unit 21. The rinse nozzle 76 serves as a rinse liquid discharging unit configured to discharge a rinse liquid toward the peripheral portion of the wafer W held by the substrate holding unit 21. If a discharge angle of the processing liquid with respect to the peripheral portion of the wafer W is close to a right angle (i.e., 90°) with respect to a processing surface of the peripheral portion, the processing liquid that has reached on the peripheral portion may be spattered back toward a rotation center of the substrate to adhere to an unintended position, so that the substrate is contaminated. Thus, by discharging the processing liquid toward the outer peripheral side of the wafer W inclinedly, the spattering-back of the processing liquid toward the rotation center of the wafer W can be suppressed.

Further, the substrate processing apparatus 1 includes the substrate holding unit 21 configured to hold the wafer W horizontally; a rotational driving unit 24 configured to rotate the substrate holding unit 21; a cup body 3 provided to cover the wafer W from a lateral side thereof; and a cover member 5 provided to face the top surface of the wafer W with a space therebetween.

The substrate holding unit 21 serves as a rotating/holding unit configured to hold and rotate the wafer W by being driven through a rotational driving shaft 22. According to the present exemplary embodiment, the substrate holding unit 21 is configured to hold the wafer W horizontally without coming into contact with the peripheral portion of the wafer W in order not to hamper the bevel cutting processing. By way of example, the substrate holding unit 21 is configured as a vacuum chuck which attracts and holds a central portion of the bottom surface of the wafer W. The rotational driving unit 24 includes the rotational driving shaft 22 configured to support the substrate holding unit 21; and a motor 23 configured to rotate the rotational driving shaft 22. By rotating the rotational driving shaft 22 through the motor 23, the wafer W held by the substrate holding unit 21 can be rotated around a vertical axis line.

The cup body 3 is implemented by a ring-shaped member and is placed to surround the substrate holding unit 21 and the side end portion of the wafer W. The cup body 3 has an opening 46 into which the wafer W can be inserted. A groove 33 extended in a circumferential direction is formed in the cup body 3, and this groove 33 is opened upwards. The groove 33 includes a ring-shaped gas exhaust space 34 and a ring-shaped liquid-receiving space 35 divided by a wall 36. The gas exhaust space 34 forms a path for exhausting a gas generated during a liquid processing or a gas flown to the vicinity of the wafer W to the outside. The liquid-receiving space 35 forms a path for receiving the processing liquid or the rinse liquid scattered from the wafer W during the liquid processing and draining the received liquid to the outside. The wall 36 is configured such that a liquid component dispersed in the gas flow is separated from the gas flow within the liquid-receiving space 35.

Further, the cup body 3 is equipped with an elevating device 47 configured to move the cup body 3 up and down.

The cover member 5 shown in FIG. 1 is of a ring shape and has a cover opening 55 at a center thereof. Basically, in a configuration where the cover member 5 is placed above the wafer W, only the peripheral portion of the wafer W and the vicinity thereof are covered by the cover member 5. The cover member 5 is equipped with an elevating device 48 configured to move the cover member 5 up and down.

A gas discharged from a non-illustrated gas supply opening provided above the cover member 5 flows outwards from a center side of the wafer W in a space between the cover member 5 and the wafer W. Accordingly, the processing liquid discharged from the chemical liquid nozzle 73 toward the wafer W is suppressed from reaching the center side of the wafer W. Therefore, the processing liquid can be suppressed from adhering to an unintended position of the wafer W so that contamination of the wafer W can be suppressed. Desirably, the gas discharged from the non-illustrated gas supply opening may be, by way of example, but not limitation, an inert gas such as nitrogen or dry air.

Figure 2A:
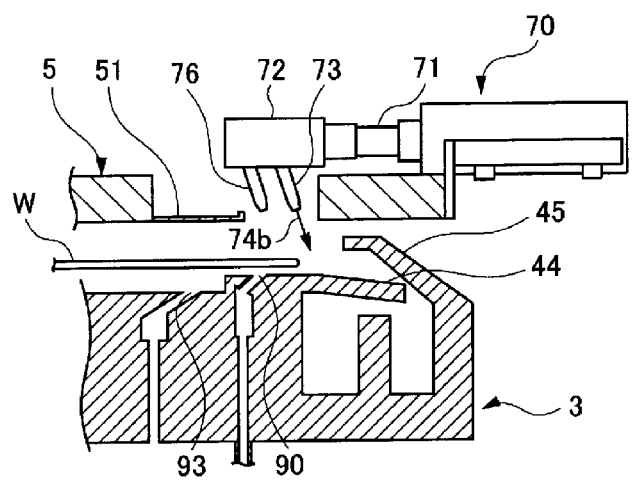
FIG. 2A to FIG. 2C are enlarged sectional view illustrating a nozzle driving unit and a cover member.
Figure 2B:
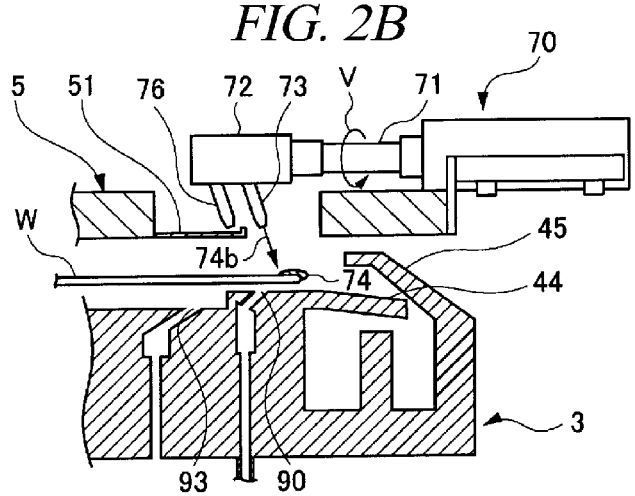
Figure 2C:
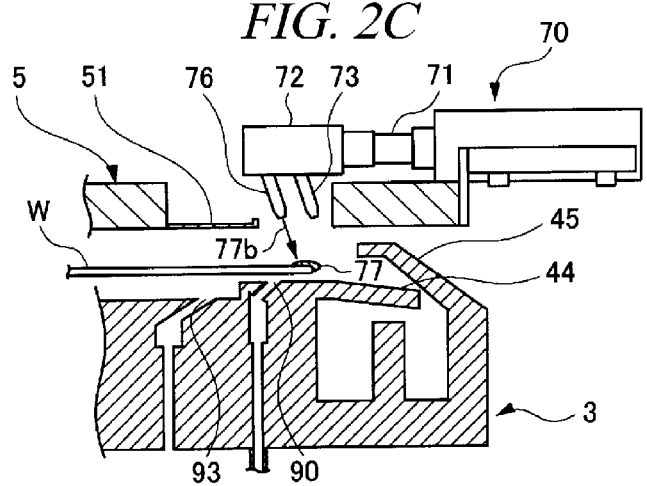

FIG. 2A to FIG. 2C are enlarged cross sectional views illustrating the nozzle driving unit 70 and the cover member 5. FIG. 2A illustrates a dummy-dispense arrangement for discharging the processing liquid to the outside of the wafer W; FIG. 2B, a chemical liquid processing arrangement for discharging the processing liquid toward the peripheral portion of the wafer W; and FIG. 2C, a rinse processing arrangement for discharging the rinse liquid toward the peripheral portion of the wafer W.

The nozzle driving unit 70 mounted to the cover member 5 includes a nozzle head 72 configured to support the chemical liquid nozzle 73 and the rinse nozzle 76; and a head supporting shaft 71 configured to support the nozzle head 72 and be extensible/contractible in an axis direction thereof. The head supporting shaft 71 is placed such that the axis direction thereof is substantially parallel to a diametric direction of the wafer W. By adjusting an extension/contraction amount of the head supporting shaft 71, the positions of the chemical liquid nozzle 73 and the rinse nozzle 76 with respect to the diametric direction of the wafer W can be varied. Thus, the chemical liquid nozzle 73 and the rinse nozzle 76 can be located at required positions in the diametric direction.

By way of example, when dummy-dispensing is performed to stabilize a liquid flow 74b of the processing liquid discharged from the chemical liquid nozzle 73, the chemical liquid nozzle 73 is placed as shown in FIG. 2A, and the processing liquid is discharged from the chemical liquid nozzle 73 toward the inside of the cup body 3 which is located outside the wafer W. Further, in case of discharging the processing liquid toward the peripheral portion of the wafer W from the chemical liquid nozzle 73, the chemical liquid nozzle 73 is placed as illustrated in FIG. 2B, and a processing liquid 74 is supplied to the peripheral portion of the wafer W. Furthermore, in case of discharging the rinse liquid toward the peripheral portion of the wafer W from the rinse nozzle 76, the rinse nozzle 76 is placed as shown in FIG. 2C, and a liquid flow 77b of the rinse liquid from the rinse nozzle 76 is directed toward the peripheral portion of the wafer W, so that a rinse liquid 77 is supplied to the peripheral portion of the wafer W. Further, the placement of the chemical liquid nozzle 73 and the rinse nozzle 76 are not limited to the examples shown in FIG. 2A to FIG. 2C, and the chemical liquid nozzle 73 and the rinse nozzle 76 can be placed at any optimum positions required. By way of example, in case of discharging neither the processing liquid from the chemical liquid nozzle 73 nor the rinse liquid from the rinse nozzle 76, the chemical liquid nozzle 73 and the rinse nozzle 76 are placed above a liquid-receiving portion 51 of the cover member 5. With this placement, even if processing liquid drops or rinse liquid drops fall down respectively from the chemical liquid nozzle 73 or the rinse nozzle 76, the processing liquid drops or the rinse liquid drops fall down onto the liquid-receiving portion 51. Therefore, the wafer W is not contaminated with the processing liquid drops or the rinse liquid drops.

Furthermore, the nozzle driving unit 70 according to the present exemplary embodiment also serves as a discharge driving unit configured to change a discharge angle and a discharge position of the processing liquid with respect to the peripheral portion of the wafer W. To elaborate, the nozzle driving unit 70 is capable of changing a discharge angle of the processing liquid from the chemical liquid nozzle 73 and a discharge angle of the rinse liquid from the rinse nozzle 76 by rotating the head supporting shaft 71 around the axis (see an arrow V in FIG. 2B) extended in an extending/contracting direction under the control of a controller 7 (see FIG. 1). Further, the nozzle driving unit 70 is capable of changing a discharge position of the processing liquid from the chemical liquid nozzle 73 and a discharge position of the rinse liquid from the rinse nozzle 76 by extending and contracting the head supporting shaft 71 under the control of the controller 7. Here, the term "discharge position" refers to a landing position of the processing liquid and the rinse liquid on the top surface of the wafer W.

Further, the aforementioned discharge driving unit may be implemented by a device other than the nozzle driving unit 70. For example, though not shown, a motor capable of changing a direction of the chemical liquid nozzle 73 may be mounted to the chemical liquid nozzle 73, and the discharge angle and the discharge position of the processing liquid from the chemical liquid nozzle 73 can be altered by driving the motor under the control of the controller 7. In such a case, the head supporting shaft 71 need not be rotated around the axis line thereof (see the arrow V in FIG. 2B). The motor may be provided for each of the chemical liquid nozzle 73 and the rinse nozzle 76 independently, or directions of both the chemical liquid nozzle 73 and the rinse nozzle 76 can be changed by using a single motor. An arrangement position of the motor may not be particularly limited. For example, the motor capable of adjusting the direction of the chemical liquid nozzle 73 can be provided within the nozzle head 72.

The substrate processing apparatus 1 depicted in FIG. 1 and FIG. 2A to FIG. 2C is also capable of performing the bevel cutting processing for a peripheral portion of a bottom surface of the wafer W by discharging the processing liquid and the rinse liquid from below the peripheral portion of the wafer W. That is, a chemical liquid discharge opening 90 and a rinse liquid discharge opening 93 may be additionally formed in an inner peripheral portion of the cup body 3. As depicted in FIG. 1, the chemical liquid discharge opening 90 is connected to a second chemical liquid supply unit 92 via a supply line 92a, and the rinse liquid discharge opening 93 is connected to a second rinse liquid supply unit 94 via a supply line 94a.

Furthermore, a cleaning liquid discharge opening 40 and a gas supply opening (not shown) are also formed in the inner peripheral portion of the cup body 3. The cleaning liquid discharge opening 40 is connected to a ring-shaped buffer 40a in which a cleaning liquid is stored, and the wafer W (particularly, the bottom surface thereof) can be cleaned by the cleaning liquid discharged from the cleaning liquid discharge opening 40. A gas such as an inert gas (e.g., nitrogen) or dry air is supplied into the gas supply opening formed in the inner peripheral portion of the cup body, and the chemical liquid or the rinse liquid can be suppressed from reaching the center side of the wafer W by the gas discharged to the bottom surface of the wafer W from this gas supply opening.

The substrate processing apparatus 1 is equipped with the controller 7 configured to control an overall operation of the substrate processing apparatus 1. The controller 7 controls operations of all functional components (e.g., the motor 23, the elevating devices 47 and 48, the cleaning liquid supply unit, the gas supply unit, the nozzle driving unit 70, the chemical liquid supply units 75 and 92, the rinse liquid supply units 78 and 94, and so forth) of the substrate processing apparatus 1.

Furthermore, the controller 7 also serves as a variation acquiring unit configured to acquire information upon a variation amount of a deformation of the peripheral portion of the wafer W in the thickness direction thereof (i.e., the vertical direction). Particularly, in the present exemplary embodiment, the information upon the variation amount of the deformation of the peripheral portion of the wafer W in the thickness direction is measured by a sensor (indicated by a reference numeral 11 of FIG. 5 to be described later) configured to measure a deformation of the peripheral portion of the wafer W in the thickness direction thereof. The acquired information is sent to the controller 7 from the sensor. In addition, the controller 7 also serves as a discharge controller configured to control the discharge angle and the discharge position of the processing liquid onto the peripheral portion of the wafer from the chemical liquid nozzle 73 via the nozzle driving unit such as the head supporting shaft 71 based on the information upon the variation amount of the deformation of the peripheral portion of the wafer W.

Moreover, the controller 7 also serves as a distance controller configured to adjust a distance between the wafer W and a closely spaced member disposed above and/or below the wafer W. By way of example, as the controller 7 controls the elevating device 48, distances between the wafer W (particularly, the top surface thereof) and the cover member 5, the liquid-receiving portion 51, the chemical liquid nozzle 73, the rinse nozzle 76 and other closely spaced members moved up and down along with the cover member 5 in the substrate processing apparatus 1, which are disposed above the wafer W, can be adjusted. Furthermore, as the controller 7 controls the elevating device 47, distances between the wafer W (particularly, the bottom surface thereof) and the cup body 3 and other closely spaced members moved up and down along with the cup body 3 in the substrate processing apparatus 1, which are disposed below the wafer W, can be adjusted. The controller 7 acquires the information upon the variation amount of the deformation (particularly, the amount of deformation in the thickness direction) of the peripheral portion of the wafer W, and adjusts the distance between the aforementioned closely spaced members and the wafer W based on the information, so that unintended contact between the closely spaced members and the wafer W can be suppressed.

In addition, the controller 7 may be implemented by a combination of hardware and software. By way of example, a general-purpose computer may be used as the hardware, and programs (an apparatus control program, a processing recipe, etc.) for operating the general-purpose computer may be used as the software. The software is stored in a recording medium (that is, a computer-readable non-temporary recording medium) readable by the hardware. Thus, the software may be stored in a recording medium such as a hard disk drive fixed in the computer, or may be stored in a recording medium such as a CD-ROM, a DVD or a flash memory detachably installed (set) in the computer.

[Bevel Cutting Processing]

Now, details of the bevel cutting processing performed by the above-described substrate processing apparatus 1 will be explained. In the following, the bevel cutting processing upon the top surface of the wafer W performed by using the processing liquid discharged from the chemical liquid nozzle 73 will be discussed.

Figure 3A:
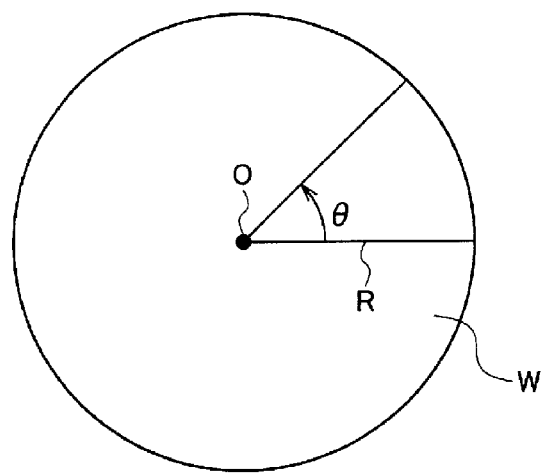
FIG. 3A and FIG. 3B are diagrams for describing a wafer angle and a cutting width.
Figure 3B:
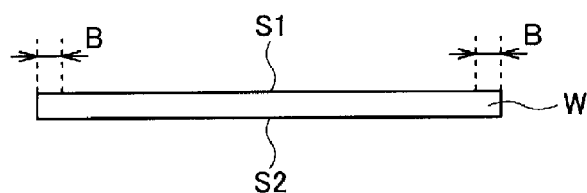

FIG. 3A and FIG. 3B are diagrams for describing a wafer angle θ and a cutting width B. FIG. 3A presents a plan view of a wafer W, and FIG. 3B is a cross sectional view of the wafer W. As depicted in FIG. 3A, the wafer angle θ is defined as an angle formed with respect to a reference line R extended in a diametric direction of the wafer W around a central axis line O of the wafer. The cutting width B represents a width of a film removed from a peripheral portion of the wafer W by the processing liquid. As shown in FIG. 3B, a range of the cutting width B is defined by a distance from the outermost portion of the wafer W. Further, in FIG. 3B, a reference numeral S1 represents an upper-side surface (that is, the top surface) of the wafer W adjacent to the chemical liquid nozzle 73 and the rinse nozzle 76, and a reference numeral S2 denotes a lower-side surface (that is, the bottom surface) of the wafer W adjacent to the chemical liquid discharge opening 90 and the rinse liquid discharge opening 93.

Figure 4:
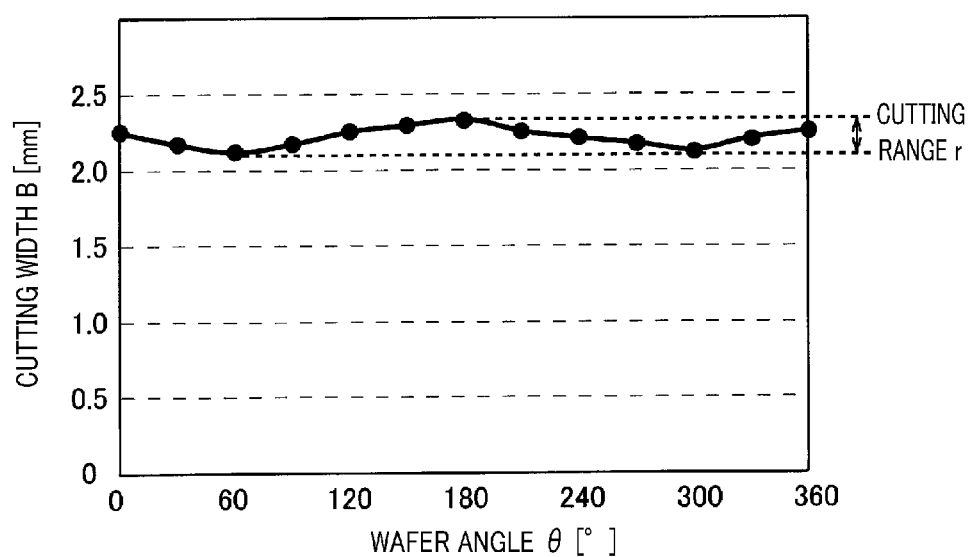
FIG. 4 is a diagram showing an example of a relationship between the wafer angle (horizontal axis) and the cutting width (vertical axis)

FIG. 4 is a diagram showing an example of a relationship between the wafer angle θ (horizontal axis) and the cutting width B (vertical axis). Though an ideal cutting width B has a constant value regardless of the wafer angle θ, an actual cutting width B is varied as the wafer angle θ is changed, as shown in FIG. 4. A "cutting range r" is defined by a difference between a maximum value and a minimum value of the cutting width B over the entire circumference of the wafer W (that is, in a range of "0°≤wafer angle θ<360°") (that is, cutting range r=maximum cutting width−minimum cutting width). Thus, a smaller cutting range r indicates that the bevel cutting processing is performed with high accuracy. To guarantee the quality of the wafer W (particularly, the quality of the bevel cutting processing), it is required to set the cutting range r to be equal to or smaller than a required value (target value).

The magnitude of the cutting range r varies according to non-uniformity in a position of the top surface of the peripheral portion of the wafer W in the thickness direction thereof. With an increase of a variation amount of the position of the top surface of the peripheral portion of the wafer W in the thickness direction, the cutting range r also increases. The variation amount of the top surface of the peripheral portion of the wafer W in the thickness direction is measured by a distance detecting sensor, and this measurement result is sent to the controller 7 from the distance detecting sensor as information upon the variation amount of the deformation of the peripheral portion.

Figure 5:
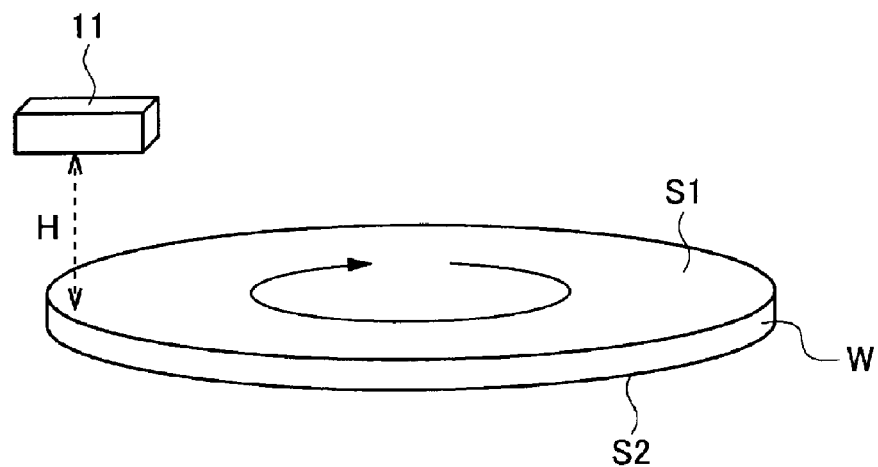
FIG. 5 is a diagram illustrating an example of an arrangement of the wafer and a distance detecting sensor.

FIG. 5 is a diagram illustrating an example of arrangement of the wafer W and the distance detecting sensor 11. The substrate processing apparatus 1 according to the present exemplary embodiment further includes the distance detecting sensor 11 which is placed at a position above the wafer W held by the substrate holding unit 21, facing the wafer W. The distance detecting sensor 11 is configured to measure a top surface detection height H indicating a distance between the peripheral portion of the wafer W and the distance detecting sensor 11, and may be implemented by, for example, an optical sensor. The distance detecting sensor 11 measures the deformation amount of the peripheral portion of the wafer W in the thickness direction thereof. As a downward bending amount of the wafer W increases, the top surface detection height H is increased as well. Further, since the bevel cutting processing is generally performed over a range of 0.5 mm to 3 mm inwardly from the outermost portion of the top surface S1 of the wafer W, it is desirable that the distance detecting sensor 11 measures the top surface detection height H within that range.

The distance detecting sensor 11 according to the present exemplary embodiment is held in a fixed place. By performing the measurement by the distance detecting sensor 11 while rotating the wafer W by the substrate holding unit 21, information upon the top surface detection height H is obtained over the entire circumference of the peripheral portion of the wafer W. Though a specific arrangement position of the distance detecting sensor 11 is not particularly limited, the distance detecting sensor 11 may be provided on a surface of the cover member 5 facing the peripheral portion of the wafer W, for example. Particularly, in the present exemplary embodiment, since the cutting width B of the bevel cutting processing of the top surface S1 of the wafer W is controlled, it is desirable to provide the distance detecting sensor 11 at a position where the top surface detection height H of the top surface S1 of the wafer W can be measured.

If, however, it can be assumed that the thickness of the wafer W is substantially uniform, non-uniformity in the position of the top surface S1 of the wafer W is mainly caused as the wafer W is bent, and the position of the top surface S1 of the wafer W and the position of the bottom surface S2 thereof are closely related. Accordingly, in such a case, the position of the bottom surface S2 of the wafer W may be measured by the distance detecting sensor 11, and the top surface detection height H of the top surface S1 of the wafer W may be estimated from the measurement result. Further, the distance detecting sensor 11 may be provided at an outside of the substrate processing apparatus 1. By way of example, the distance detecting sensor 11 may be provided in a dedicated module provided at the front of the substrate processing apparatus 1, and information regarding the top surface detection height H over the entire circumference of the peripheral portion of the wafer W may be acquired by the distance detecting sensor 11 before the wafer W is carried into the substrate processing apparatus 1. In this case, the information regarding the top surface detection height H obtained by the distance detecting sensor 11 may be sent to the controller 7 from the distance detecting sensor 11 as data indicating the information on the variation amount of the deformation of the peripheral portion.

Figure 6:
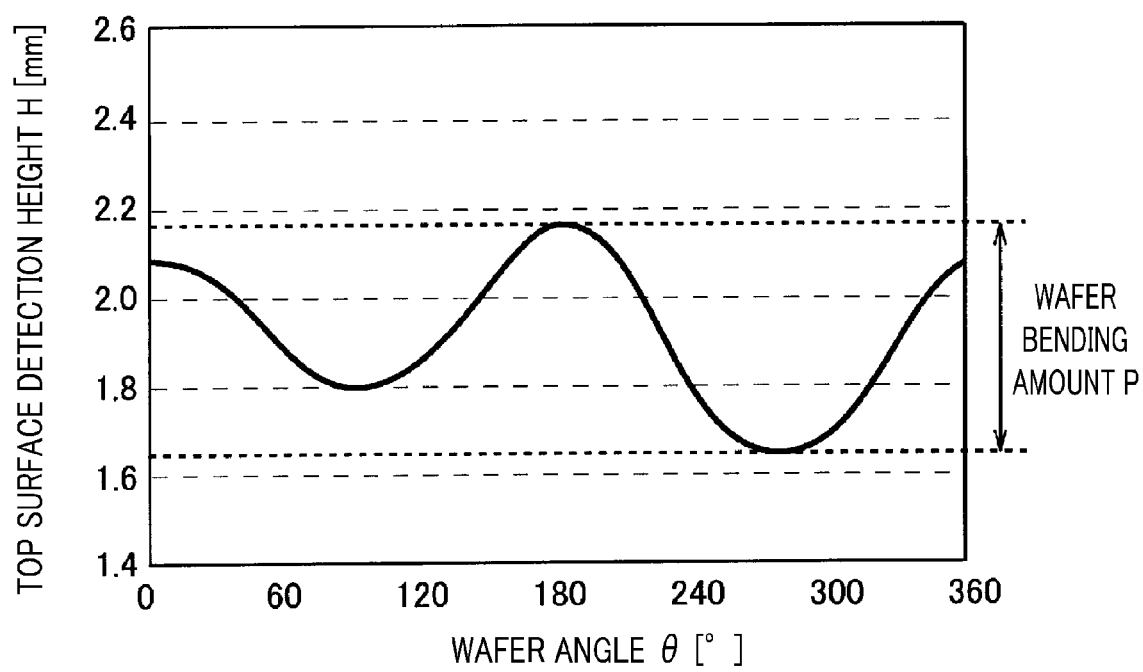
FIG. 6 is diagram illustrating an example of relationship between the wafer angle (horizontal axis) and a top surface detection height H (vertical axis)

FIG. 6 is a diagram illustrating an example of a relationship between the wafer angle θ (horizontal axis) and the top surface detection height H (vertical axis). As stated above, the position of the top surface S1 of the wafer W is not actually uniform in the thickness direction. As an index indicating the degree of the non-uniformity in the position of the top surface S1 of the wafer W in the thickness direction, a "wafer bending amount P" may be used. This wafer bending amount P is defined by a difference between a maximum value and a minimum value of the top surface detection height H over the entire circumference of the wafer W (i.e., in a range from 0°≤wafer angle θ<360°) (that is, wafer bending amount P=maximum top surface detection height−minimum top surface detection height). Thus, a larger wafer bending amount P indicates that the degree of the non-uniformity in the position of the top surface S1 of the peripheral portion of the wafer W is large in the thickness direction, and a smaller wafer bending amount P indicates that the degree of the non-uniformity in the top surface S1 of the peripheral portion of the wafer W is small in the thickness direction.

In consideration of the characteristic of the wafer bending amount P, the substrate processing apparatus 1 according to the exemplary embodiment performs the bevel cutting processing on the top surface S1 of the wafer W according to a substrate processing method including the following processes.

That is, a process of carrying a wafer W as a target of the bevel cutting processing into the substrate processing apparatus 1 and holding the wafer W by the substrate holding unit 21 is performed. Then, a process of acquiring the aforementioned wafer bending amount P as the information regarding the variation amount of the deformation of the peripheral portion of the top surface S1 of the wafer W in the thickness direction is performed. As stated above, this wafer bending amount P may be measured by the distance detecting sensor 11 provided in the substrate processing apparatus 1 after the carrying of the wafer W into the substrate processing apparatus 1 is performed, or may be measured by the distance detecting sensor 11 before the carrying of the wafer W into the substrate processing apparatus 1 is performed. Then, a process of controlling the discharge angle and the discharge position of the processing liquid from the chemical liquid nozzle 73 with respect to the peripheral portion is performed based on the acquired wafer bending amount P. Subsequently, a process of discharging the processing liquid from the chemical liquid nozzle 73 toward the peripheral portion of the top surface S1 of the wafer W being rotated is performed, so that the processing liquid is supplied to the peripheral portion of the top surface S1 of the wafer W.

Hereinafter, examples of a typical method of controlling the discharge angle and the discharge position of the processing liquid from the chemical liquid nozzle 73 based on the wafer bending amount P will be explained. Further, in any of the control methods to be described in the following, by controlling the discharge driving unit such as the nozzle driving unit 70 or the like through the controller 7, the discharge angle and the discharge position of the processing liquid from the chemical liquid nozzle 73 is adjusted to reduce the variation of the cutting width B, so that the cutting range r is reduced to equal to or less than a target value. Further, the discharge position (that is, landing position) of the processing liquid on the top surface S1 of the wafer W is set to a preset position determined based on the required cutting width B. The discharge position is set to a substantially same position regardless of the variation in the discharge angle.

[First Control Method]

Figure 7:
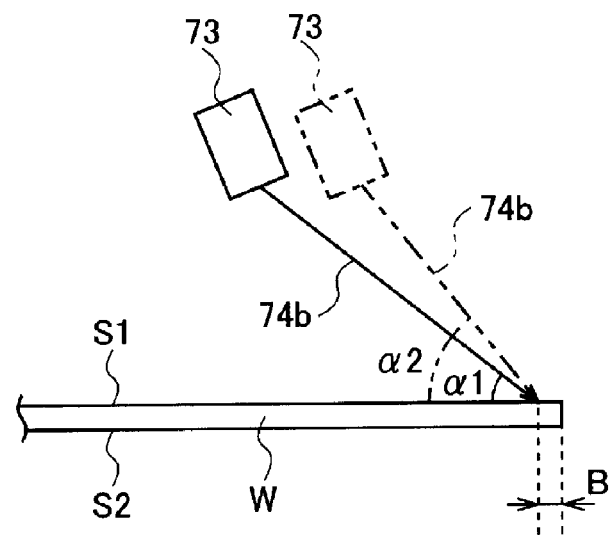
FIG. 7 is a cross sectional view for describing a control of a discharge angle of the processing liquid from a chemical liquid nozzle according to a first control method, and the chemical liquid nozzle and the wafer are schematically illustrated.

FIG. 7 is a cross sectional view for describing a control of the discharge angle of the processing liquid from the chemical liquid nozzle 73 according to a first control method, and the chemical liquid nozzle 73 and the wafer W are schematically illustrated.

In the present control method, the discharge angle of the processing liquid controlled by the controller 7 is a first angle α formed by a "traveling direction of the processing liquid discharged from the chemical liquid nozzle 73 toward the peripheral portion of the wafer W" and an "extending direction of a processing surface (i.e., the top surface S1 in the present exemplary embodiment) of the peripheral portion of the wafer W on which the processing liquid is supplied."

In general, as the first angle α gets smaller, an influence upon a position variation of the top surface S1 of the wafer W in the thickness direction thereof is increased, so that the deviation amount of the landing position of the processing liquid on the peripheral portion of the wafer W from a target position is increased (see a reference numeral C (landing position deviation amount) of FIG. 13 to be described later). By way of example, the landing position on the top surface S1 of the wafer W in the liquid flow 74b of the processing liquid discharged from the chemical liquid nozzle 73 at the "first angle=α1" as indicated by a solid line in FIG. 7 tends to be more deviated from the target position than that in the liquid flow 74b of the processing liquid discharged from the chemical liquid nozzle 73 at the "first angle=α2" (here, α2>α1) as indicated by a dashed double-dotted line in FIG. 7.

Figure 8:
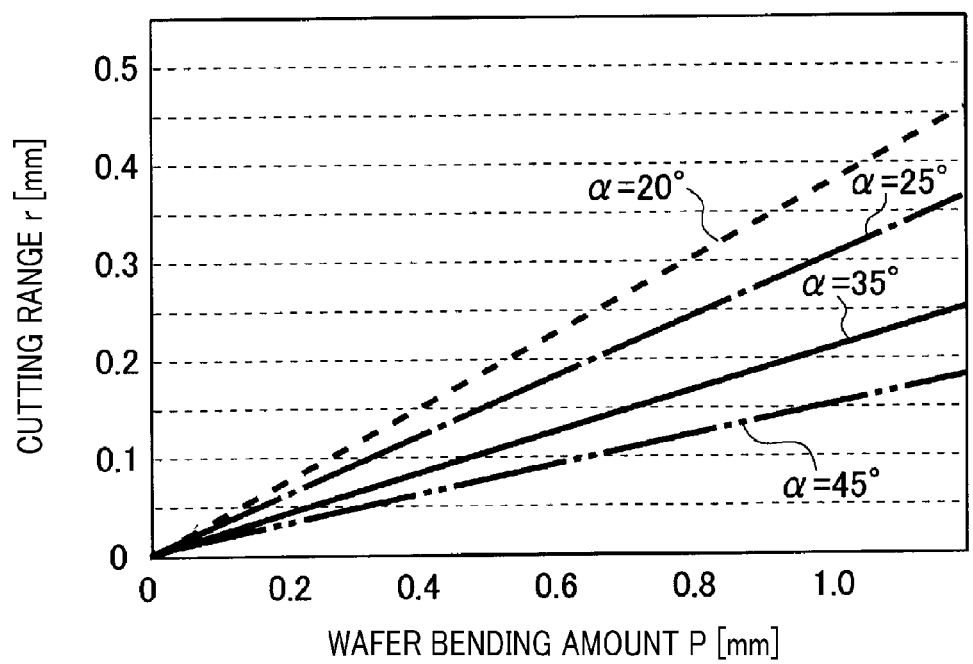
FIG. 8 is a diagram showing an example of a relationship between a wafer bending amount (horizontal axis) and a cutting range (vertical axis) with regard to the discharge angle (first angle) of the processing liquid according to the first control method.

FIG. 8 is a diagram showing an example of a relationship between the wafer bending amount P (horizontal axis) and the cutting range r (vertical axis) with respect to the discharge angle (i.e., the first angle α) of the processing liquid according to the first control method. In FIG. 8, an example of the relationship between the wafer bending amount P and the cutting range r is shown when the first angle α is 20°, 25°, 35° and 45°, respectively.

As can be clearly seen from FIG. 8, as the first angle α indicating the discharge angle of the processing liquid from the chemical liquid nozzle 73 decreases, an influence of the wafer bending amount P upon the increase or the decrease of the cutting range r is increased. Therefore, from the viewpoint of reducing the influence of the wafer bending amount P upon the cutting range r, it is desirable to set the first angle α to be large. If, however, the first angle α increases, the amount and the probability of spattering-back of the processing liquid once having landed on the top surface S1 of the wafer W toward the center side (that is, the device portion) of the wafer W tend to be increased. Therefore, it is desirable to discharge the processing liquid from the chemical liquid nozzle 73 at an optimal first angle α where the influence of the wafer bending amount P upon the cutting range r is suppressed while suppressing the spattering-back of the processing liquid toward the center side of the wafer W.

Figure 9:
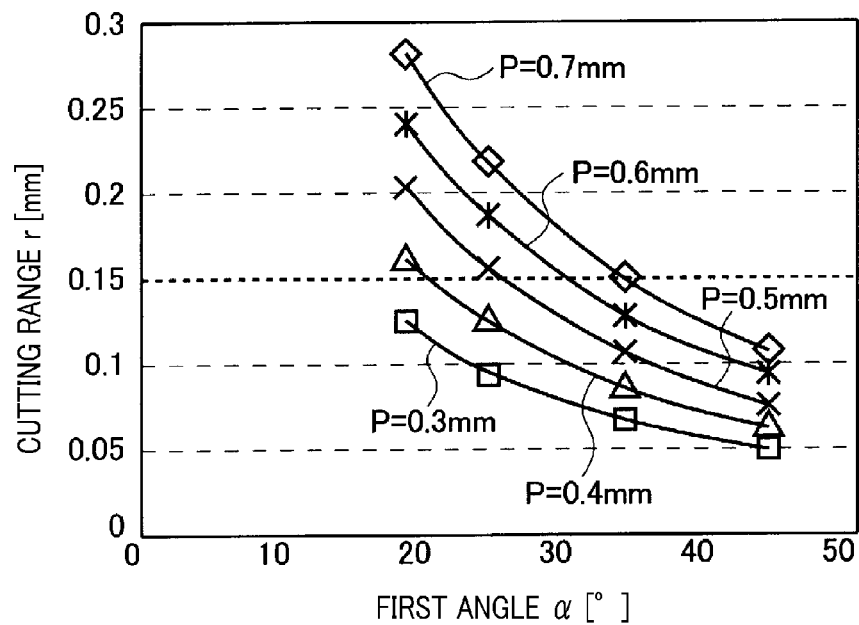
FIG. 9 is a diagram showing an example of a relationship between the first angle (horizontal axis) and the cutting range (vertical axis) with regard to the wafer bending amount according to the first control method.

FIG. 9 is a diagram showing an example of the relationship between the first angle α (horizontal axis) and the cutting range r (vertical axis) with respect to the wafer bending amount P according to the first control method. In FIG. 9, an example of the relationship between the first angle α and the cutting range r is shown when the wafer bending amount P is 0.3 mm, 0.4 mm, 0.5 mm, 0.6 mm and 0.7 mm, respectively.

For example, assume that the target value of the cutting range r is 0.15 mm. In this case, if the wafer bending amount P is found to be 0.7 mm based on the measurement result of the distance detecting sensor 11 (see FIG. 5), the first angle α at a point corresponding to the "cutting range r=0.15 mm" on the line of "P=0.7 mm" shown in FIG. 9 becomes the optimal first angle α (about 35° in the example shown in FIG. 9). For another wafer bending amount P, the optimal first angle α corresponding thereto can be obtained in the same way as stated above.

As discussed above, the controller 7 is capable of calculating the optimal first angle α based on the target value of the cutting range r and the wafer bending amount P obtained from the measurement result of the distance detecting sensor 11. Further, the controller 7 is capable of setting the cutting range r to be equal to or smaller than the target value through the adjustment of the direction of the chemical liquid nozzle 73 by controlling the discharge driving unit (i.e., the nozzle driving unit 70 in the present exemplary embodiment) such that the processing liquid is discharged from the chemical liquid nozzle 73 at the optimal first angle α or an angle larger than that.

In the above-described control method, the controller 7 controls the discharge angle of the processing liquid from the chemical liquid nozzle 73 such that the first angle α is increased as the variation amount of the deformation of the peripheral portion of the wafer W in the thickness direction is increased. That is, the controller 7 controls the discharge angle of the processing liquid from the chemical liquid nozzle 73 such that the cutting range r (i.e., a landed liquid variation amount) indicating the variation amount of the distance of the landing position of the processing liquid on the peripheral portion of the wafer W from the outermost peripheral portion of the wafer W becomes the target value or less. This cutting range r can be obtained by taking the first angle α into account from the information (i.e., the wafer bending amount P) regarding the variation amount of the deformation of the peripheral portion of the wafer W in the thickness direction which is obtained from the measurement result of the distance detecting sensor 11 (see FIG. 8).

Furthermore, the target value of the cutting range r may be a predetermined specific value, or a variable value. In case that the target value of the cutting range r is a variable value, the controller 7 may acquire information upon the target value of the cutting range r and determined the target value based on the acquired information. By way of example, the information upon the target value of the cutting range r may be information upon a required cutting range r input to the controller 7 by a user. In the above-mentioned example, though the target value of the cutting range r is set to be 0.15 mm, the target value of the cutting range r may not be limited thereto and may be set to be, for example, 0.2 mm. Moreover, the target value of the cutting range r may be varied depending on each of the wafers W as the targets of the bevel cutting processing.

[Second Control Method]

Figure 10:
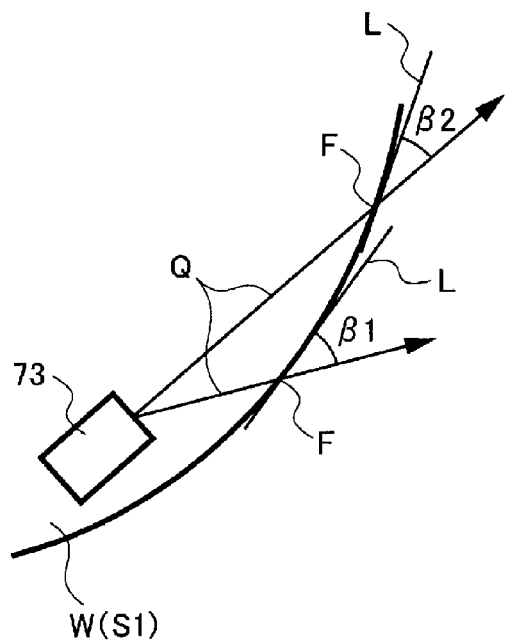
FIG. 10 is an enlarged plan view for describing a control of the discharge angle of the processing liquid from the chemical liquid nozzle according to a second control method, and the chemical liquid nozzle and the wafer are schematically illustrated.

FIG. 10 is an enlarged plan view for describing a control of the discharge angle of the processing liquid from the chemical liquid nozzle 73 according to a second control method. FIG. 10 schematically illustrates the chemical liquid nozzle 73 and the wafer W.

In the present control method, the discharge angle of the processing liquid controlled by the controller 7 is a second angle β formed by "a direction of a projected traveling path Q obtained as a traveling path of the processing liquid discharged from the chemical liquid nozzle 73 toward the peripheral portion of the wafer W is projected on the wafer W" and "a direction of a tangent L of the wafer W at an intersecting point F between an extension line of the projected traveling path Q and an outermost peripheral portion of the top surface S1 of the wafer W".

In general, as the second angle β regarding the horizontal direction gets larger, the influence upon the position variation of the top surface S1 of the wafer W in the thickness direction thereof is increased, so that the deviation amount of the landing position of the processing liquid on the peripheral portion of the wafer W from a target position is increased (see the reference numeral C (landing position deviation amount) of FIG. 13 to be described later). By way of example, on the top surface S1 of the wafer W, the landing position of the processing liquid discharged from the chemical liquid nozzle 73 at the "second angle=β1" tends to be more deviated from the target position than the landing position of the processing liquid discharged from the chemical liquid nozzle 73 at the "second angle=β2" (here, β2<β1).

Figure 11:
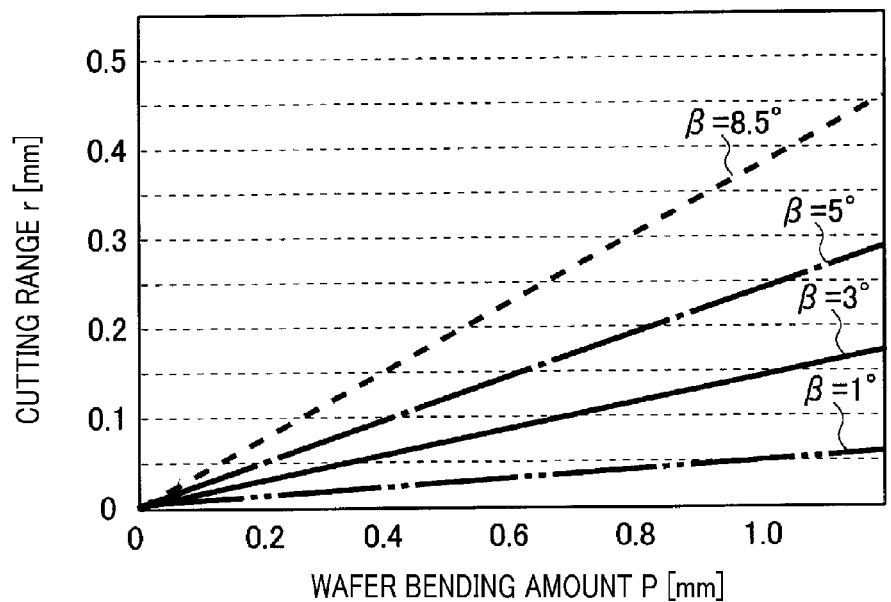
FIG. 11 is a diagram showing an example of a relationship between the wafer bending amount (horizontal axis) and the cutting range (vertical axis) with regard to the discharge angle (second angle) of the processing liquid according to the second control method.

FIG. 11 is a diagram showing an example of the relationship between the wafer bending amount P (horizontal axis) and the cutting range r (vertical axis) with respect to the discharge angle (i.e., the second angle β) of the processing liquid according to the second control method. In FIG. 11, an example of the relationship between the wafer bending amount P and the cutting range r is shown when the second angle β is 1°, 3°, 5° and 8.5°, respectively.

As can be clearly seen from FIG. 11, as the second angle β indicating the discharge angle of the processing liquid from the chemical liquid nozzle 73 increases, the influence of the wafer bending amount P upon the increase or the decrease of the cutting range r is increased. Therefore, from the viewpoint of reducing the influence of the wafer bending amount P upon the cutting range r, it is desirable to set the second angle β to be small. If, however, the second angle β deceases, utilization efficiency of the processing liquid tends to be deteriorated. Therefore, it is desirable to discharge the processing liquid from the chemical liquid nozzle 73 at an optimal second angle β where the influence of the wafer bending amount P upon the cutting range r is suppressed while suppressing the deterioration of the utilization efficiency of the processing liquid.

Figure 12:
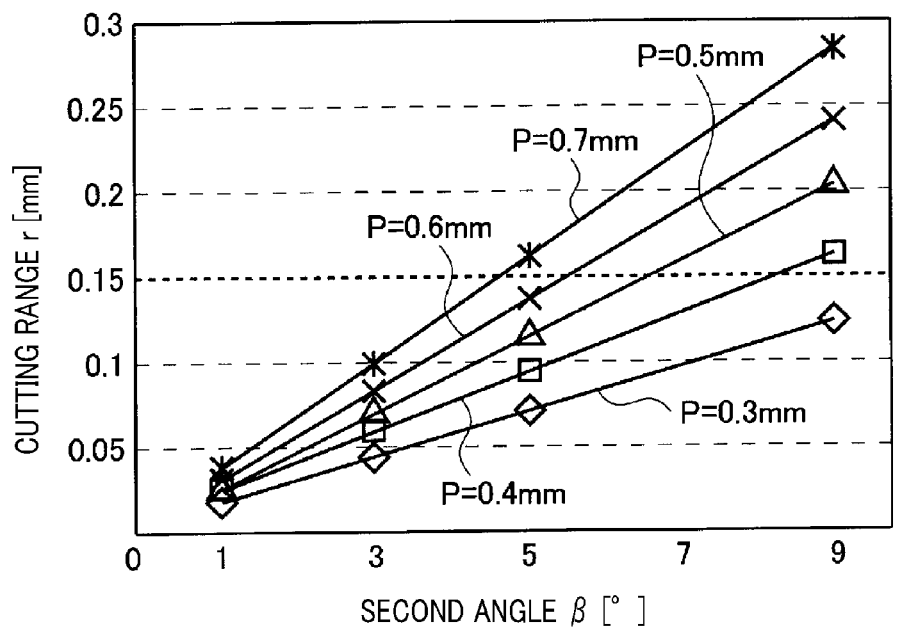
FIG. 12 is a diagram showing an example of a relationship between the second angle (horizontal axis) and the cutting range (vertical axis) with regard to the wafer bending amount according to the second control method.

FIG. 12 is a diagram showing an example of the relationship between the second angle β (horizontal axis) and the cutting range r (vertical axis) with respect to the wafer bending amount P according to the second control method. In FIG. 12, an example of the relationship between the second angle β and the cutting range r is shown when the wafer bending amount P is 0.3 mm, 0.4 mm, 0.5 mm, 0.6 mm and 0.7 mm, respectively.

For example, assume that the target value of the cutting range r is 0.15 mm. In this case, if the wafer bending amount P is found to be 0.7 mm based on the measurement result of the distance detecting sensor 11 (see FIG. 5), the second angle β at a point corresponding to the "cutting range r=0.15 mm" on the line of "P=0.7 mm" shown in FIG. 12 becomes the optimal second angle β (about 4.5° in the example shown in FIG. 12). For another wafer bending amount P, the optimal second angle β corresponding thereto can be obtained in the same way as stated above.

As discussed above, the controller 7 is capable of calculating the optimal second angle β based on the target value of the cutting range r and the wafer bending amount P obtained from the measurement result of the distance detecting sensor 11. Further, the controller 7 is capable of setting the cutting range r to be equal to or smaller than the target value through the adjustment of the direction of the chemical liquid nozzle 73 by controlling the discharge driving unit (i.e., the nozzle driving unit 70 in the present exemplary embodiment) such that the processing liquid is discharged from the chemical liquid nozzle 73 at the optimal second angle β or an angle smaller than that.

In the above-described present control method, the controller 7 controls the discharge angle of the processing liquid from the chemical liquid nozzle 73 such that the second angle β is decreased as the variation amount of the deformation of the peripheral portion of the wafer W in the thickness direction is increased. That is, the controller 7 controls the discharge angle of the processing liquid from the chemical liquid nozzle 73 such that the cutting range r (i.e., the landed liquid variation width) indicating the variation amount of the distance of the landing position of the processing liquid on the peripheral portion of the wafer W from the outermost peripheral portion of the wafer W becomes the target value or less. This cutting range r can be obtained by taking the second angle β into account from the information (i.e., the wafer bending amount P) regarding the variation amount of the deformation of the peripheral portion of the wafer W in the thickness direction which is obtained from the measurement result of the distance detecting sensor 11 (see FIG. 11).

Furthermore, the target value of the cutting range r may be a predetermined specific value, or a variable value. In case that the target value of the cutting range r is a variable value, the controller 7 may acquire information upon the target value of the cutting range r and determined the target value based on the acquired information.

[Third Control Method]

According to a third control method, a discharge direction of the processing liquid from the chemical liquid nozzle 73 is controlled by adjusting both the first angle α (first control method) and the second angle β (second control method).

Figure 13:
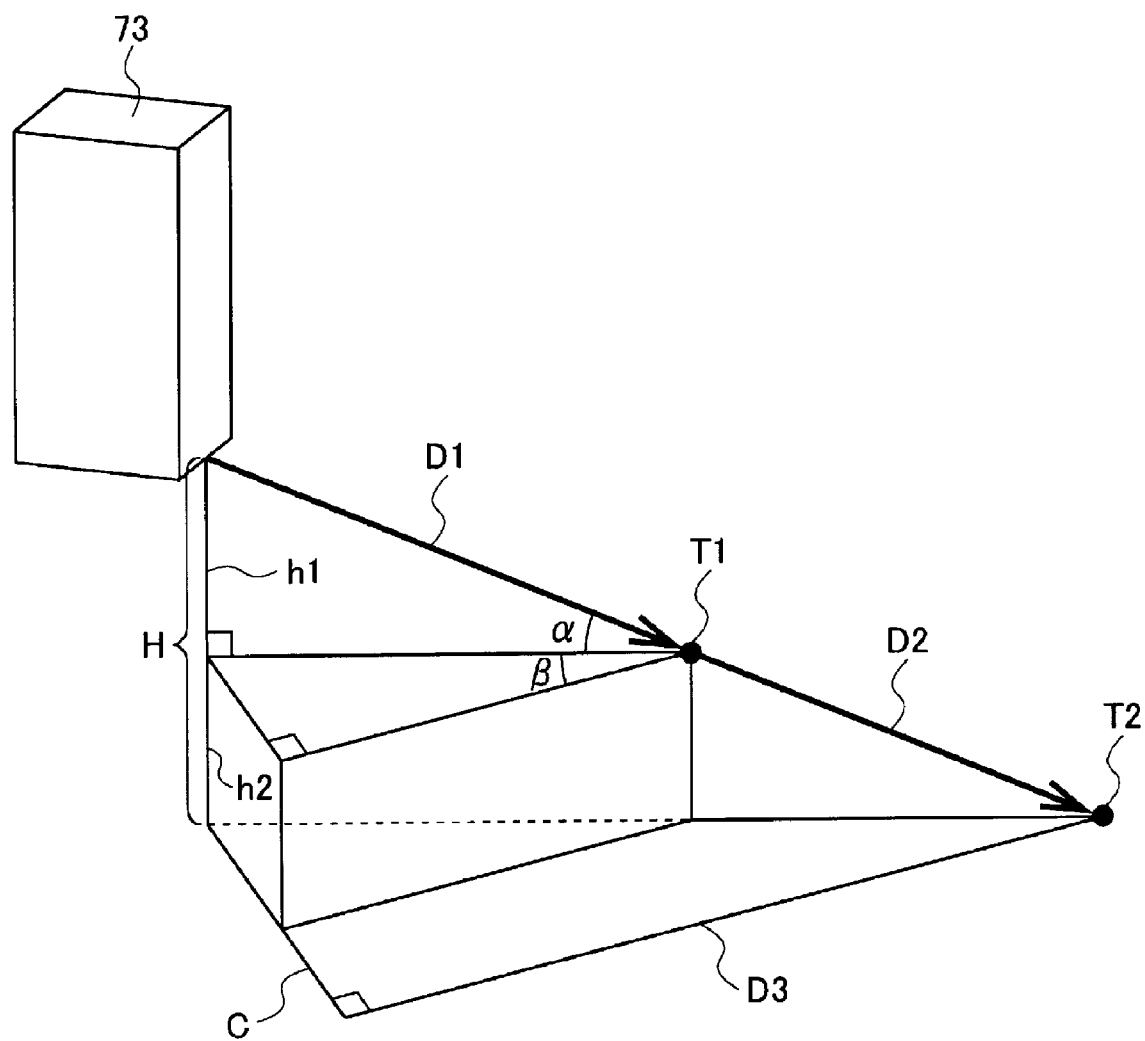
FIG. 13 is a schematic diagram for describing a landing position deviation amount C of the processing liquid from the chemical liquid nozzle.

FIG. 13 is a schematic diagram for describing the landing position deviation amount C of the processing liquid from the chemical liquid nozzle 73.

In FIG. 13, if the processing liquid discharged from the chemical liquid nozzle 73 travels along a traveling direction D1, the landing position (an ideal landing point T1) of the processing liquid on the top surface S1 of an ideal wafer W having a completely flat surface is spaced apart from the chemical liquid nozzle 73 by an ideal distance h1 in the thickness direction of the wafer W. Actually, however, the top surface S1 of the wafer W is deformed in the thickness direction due to the bending of the wafer W or the like. By way of example, if the wafer W is bent toward the bottom surface side thereof, the processing liquid discharged from the chemical liquid nozzle 73 further travels along a traveling direction D2 and lands on a position (an actual landing point T2) spaced apart from the ideal landing point T1 by a distance deviation amount h2 in the thickness direction. Accordingly, a top surface detection height H (a distance between the chemical liquid nozzle 73 and the top surface S1 of the wafer W) obtained by the distance detecting sensor 11 (see FIG. 5) is defined by a sum of the ideal distance h1 and the distance deviation amount h2.

In FIG. 13, a line which is extended in the aforementioned "direction of the tangent of the wafer W at the intersecting point F between the extension line of the projected traveling path (see the reference numeral Q of FIG. 10) and the outermost peripheral portion on the top surface S1 of the wafer W" and which passes the aforementioned actual landing point T2 is indicated by a reference numeral D3. The landing position deviation amount C, which is defined by "a difference between a position of the ideal landing point T1 and a position of the actual landing point T2" in a direction perpendicular to the line D3, is expressed by the following expression.

$$C=\{\sin\beta\times(h1+h2)/\tan\alpha\}-\{\sin\beta\times h1/\tan\alpha\}=\sin\beta\times h2/\tan\alpha \quad \text{[Expression 1]}$$

As can be clearly seen from the above expression, the landing position deviation amount C can be expressed by a function in which the distance deviation amount h2 of the top surface S1 of the wafer W and the first and second angles α and β regarding the discharge direction of the processing liquid from the chemical liquid nozzle 73 are used as parameters. That is, by adjusting at least either of the first angle α and the second angle 3 according to the distance deviation amount h2, it is possible to control the landing position deviation amount C to a required value.

The aforementioned wafer bending amount P (see FIG. 6) is based on the variation amount of the distance deviation amount h2 in FIG. 13, and the cutting range r (see FIG. 4) is based on the variation amount of the landing position deviation amount C in FIG. 13. Accordingly, by adjusting the first angle α and/or the second angle β according to the wafer bending amount P in consideration of Expression 1, the cutting range r can be controlled to the target value.

Based on the above considerations, the controller 7 determines the optimal first angle α and the optimal second angle β based on the wafer bending amount P acquired by the measurement from the distance detecting sensor 11. Further, the controller 7 may control the cutting range r to the target value by discharging the processing liquid from the chemical liquid nozzle 73 at a discharge angle based on the determined optimal first angle α and the determined optimal second angle β by controlling the discharge driving unit such as the nozzle driving unit 70.

Furthermore, with regard to the above-described first to third control methods, data such as a table in which "the discharge angle (the first angle α and/or the second angle β) of the processing liquid from the chemical liquid nozzle 73" which enables the cutting range r to be adjusted to the target value is matched with the cutting range r and the wafer bending amount P may be previously acquired and stored in a non-illustrated memory. In such a case, the controller 7 may simply and rapidly acquire "the discharge angle (the first angle α and/or the second angle β of the processing liquid from the chemical liquid nozzle 73" based on the target value of the cutting range r and the wafer bending amount P by referring to the data stored in the memory. Further, the controller 7 may adjust the direction of the chemical liquid nozzle 73 by controlling the discharge driving unit based on the acquired discharge angle. Likewise, as for the discharge position of the processing liquid, data such as a table in which "the position of the chemical liquid nozzle 73 in the horizontal direction" is matched with the cutting range r and the wafer bending amount P may be previously obtained and stored in a non-illustrated memory. In such a case, the controller 7 may acquire "the position of the chemical liquid nozzle 73 in the horizontal direction" based on the target value of the cutting range r and the wafer bending amount P by referring to the data stored in the memory. Further, the controller 7 may adjust the position of the chemical liquid nozzle 73 in the horizontal direction by controlling the discharge driving unit based on the position of the chemical liquid nozzle 73 in the horizontal direction acquired as stated above.

According to the substrate processing apparatus 1 and the substrate processing method of the exemplary embodiments as described above, even when the positions of the top surface of the peripheral portion of the wafer W are not uniform due to the bending of the wafer W or the like, the cutting width B of the bevel cutting processing can be set to be in a required range, so that the cutting width B can be uniformed. Accordingly, the film to be removed from the peripheral portion of the wafer W can be removed with high accuracy by the processing liquid while protecting the device portion at the inner side of the wafer W, where the adhesion of the processing liquid needs to be suppressed, from the processing liquid.

Although the various exemplary embodiments have been described so far, those exemplary embodiments are not limiting and can be modified in various ways. Further, the effects that would be acquired by the present exemplary embodiments are not limited to those stated above. Thus, without departing from the technical conception and essence of the present disclosure, the constituent components in the above specification and the following claims may be added, modified and partially deleted in various ways.

For example, in the above-described exemplary embodiments, the cutting range r of the top surface S1 of the wafer W is adjusted. However, a cutting range r of the bottom surface S2 of the wafer W may be adjusted in the same manner as stated above. In such a case, a device configured to control the discharge direction of the processing liquid for use in the bevel cutting processing on the bottom surface S2 of the wafer W is required. For example, the processing liquid may be discharged toward the peripheral portion of the bottom surface S2 of the wafer W from, instead of the chemical liquid discharge port 90, "a nozzle capable of changing the discharge direction of the processing liquid" such as the chemical liquid nozzle 73.

Furthermore, in the above-described exemplary embodiments, though only the chemical liquid nozzle 73 and the rinse nozzle 76 are provided as examples of the devices configured to supply the processing liquid and the rinse liquid to the top surface S1 of the peripheral portion of the wafer W, the processing liquid and the rinse liquid may be supplied to the top surface S1 of the peripheral portion of the wafer W from another device additionally provided. Likewise, the processing liquid and the rinse liquid may be supplied to the bottom surface S2 of the peripheral portion of the wafer W from another device provided separately from the chemical liquid discharge opening 90 and the rinse liquid discharge opening 93.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A substrate processing method comprising:
   providing a substrate with a film on a peripheral portion of a substrate,
   acquiring by a controller a variation amount of a deformation of the substrate in a thickness direction of the peripheral portion of the substrate; and
   controlling a discharge angle and a discharge position of a processing liquid from a discharging unit toward the peripheral portion of the substrate based on the variation amount of the deformation in the thickness direction of the peripheral portion of the substrate , wherein the processing liquid is discharged on the substrate to provide a cutting width, a width of the film removed from the peripheral portion of the substrate by the processing liquid, over the entire circumference of the substrate,
   wherein the deformation of the peripheral portion is measured with a distance detecting sensor in the thickness direction of the substrate,
   in the controlling of the discharge angle and the discharge portion of the processing liquid, the discharge angle is determined based on :
   1) the variation amount of the deformation in the thickness direction of the peripheral portion of the substrate and
   2) a target value of a cutting range,
      in the acquiring of the variation amount of the deformation in the thickness direction of the peripheral portion, information regarding a top surface detection height is measured by the distance detecting sensor, the distance detecting sensor facing the peripheral portion of the substrate and configured to measure the top surface detection height over an entire circumference of the substrate while the substrate is being rotated by a rotating/holding unit to determine the top surface detection height, the information regarding a top surface detection height is sent from the distance detecting sensor to the controller,
   wherein the information regarding the top surface detection height includes a maximum value top surface detection height and a minimum value top surface detection height over the entire circumference of the substrate,
   the variation amount of the deformation in the thickness direction includes a substrate bending amount which is obtained by subtracting the minimum top surface detection height from the maximum top surface detection height, and
   the cutting range is defined by a difference between a maximum value and a minimum value of the cutting width.

2. The substrate processing method of claim 1,
   wherein, in the controlling of the discharge angle and the discharge position of the processing liquid, the discharge angle includes a first angle formed by a traveling direction of the processing liquid discharged from the discharging unit toward the peripheral portion and an extending direction of a processing surface of the peripheral portion onto which the processing liquid is supplied.

3. The substrate processing method of claim 2,
   wherein, in the controlling of the discharge angle and the discharge position of the processing liquid, the traveling direction of the processing liquid from the discharging unit is adjusted such that the first angle is increased as the deformation of the peripheral portion is increased.

4. The substrate processing method of claim 1,
   wherein, in the controlling of the discharge angle and the discharge position of the processing liquid, the discharge angle includes a second angle formed by an extension line and a tangent line of the substrate at an intersecting point between the extension line and an outermost peripheral portion of the substrate,
   wherein the extension line is formed by projecting a traveling path of the processing liquid discharged from the discharging unit toward the peripheral portion of the substrate.

5. The substrate processing method of claim 4,
   wherein, in the controlling of the discharge angle and the discharge position of the processing liquid, a traveling direction of the processing liquid from the processing liquid discharging unit is adjusted such that the second angle is decreased as the variation amount of the deformation of the peripheral portion is increased.

6. The substrate processing method of claim 1,
   wherein, in the controlling of the discharge angle and the discharge position of the processing liquid, the discharge angle is controlled such that a landed liquid variation amount is equal to or smaller than a target value.

7. The substrate processing method of claim 6,
   wherein, in the controlling of the discharge angle and the discharge position of the processing liquid, information regarding the target value of the landed liquid variation amount is acquired and the target value based on the information regarding the target value is determined.

8. The substrate processing method of claim 1,
   wherein, in the controlling of the discharge angle and the discharge position of the processing liquid, a distance between a member disposed above and/or below the substrate and the substrate is controlled based on the variation amount of the deformation in the thickness direction of the peripheral portion acquired by the acquiring unit.

* * * * *

UNITED STATES PATENT AND TRADEMARK OFFICE
CERTIFICATE OF CORRECTION

PATENT NO. : 11,640,911 B2
APPLICATION NO. : 17/646345
DATED : May 2, 2023
INVENTOR(S) : Tatsuhiro Ueki et al.

It is certified that error appears in the above-identified patent and that said Letters Patent is hereby corrected as shown below:

In the Specification

Column 11, Line 37, "Win the thickness" should be -- W in the thickness --.

Column 15, Line 31, "angle 3" should be -- angle β --.

Signed and Sealed this
Thirtieth Day of January, 2024

Katherine Kelly Vidal
*Director of the United States Patent and Trademark Office*